(12) United States Patent
Hasebe et al.

(10) Patent No.: US 7,758,920 B2
(45) Date of Patent: Jul. 20, 2010

(54) METHOD AND APPARATUS FOR FORMING SILICON-CONTAINING INSULATING FILM

(75) Inventors: Kazuhide Hasebe, Minami-alps (JP); Mitsuhiro Okada, Kai (JP); Pao-Hwa Chou, Kai (JP); Jun Ogawa, Nirasaki (JP); Chaeho Kim, Yongin (JP); Kohei Fukushima, Oshu (JP); Toshiki Takahashi, Oshu (JP); Jun Sato, Kai (JP)

(73) Assignee: Tokyo Electron Limited, Tokyo (JP)

( * ) Notice: Subject to any disclaimer, the term of this patent is extended or adjusted under 35 U.S.C. 154(b) by 900 days.

(21) Appl. No.: 11/496,436

(22) Filed: Aug. 1, 2006

(65) Prior Publication Data

US 2007/0032047 A1 Feb. 8, 2007

(30) Foreign Application Priority Data

Aug. 2, 2005 (JP) .............................. 2005-224741

(51) Int. Cl.
 C23C 16/00 (2006.01)
 H01L 21/00 (2006.01)
(52) U.S. Cl. .................. 427/248.1; 427/8; 438/778; 118/723 R
(58) Field of Classification Search ............. 118/723 R; 438/778
 See application file for complete search history.

(56) References Cited

U.S. PATENT DOCUMENTS 6,139,640 A * 10/2000 Ramos et al. ............... 118/715

| | | | |
|---|---|---|---|
| 7,094,708 B2 * | 8/2006 | Kato et al. | 438/778 |
| 2003/0232514 A1 * | 12/2003 | Kim et al. | 438/791 |
| 2004/0020599 A1 * | 2/2004 | Tanaka et al. | 156/345.29 |
| 2004/0235263 A1 * | 11/2004 | Li et al. | 438/424 |
| 2005/0120958 A1 * | 6/2005 | Lin | 118/723 R |

FOREIGN PATENT DOCUMENTS

| | | | |
|---|---|---|---|
| JP | 2001-196365 | | 7/2001 |
| JP | 2002-60947 | | 2/2002 |
| JP | 2004-6801 | | 1/2004 |
| JP | 2004-47624 | | 2/2004 |
| JP | 2004-006801 | * | 8/2004 |
| JP | 2004-281853 | | 10/2004 |
| JP | 2005-64306 | | 3/2005 |
| KR | 10 0449028 | | 9/2004 |
| WO | WO 2004/066377 A1 | | 8/2004 |

* cited by examiner

*Primary Examiner*—Shamim Ahmed
(74) *Attorney, Agent, or Firm*—Oblon, Spivak, McClelland, Maier & Neustadt, L.L.P.

(57) ABSTRACT

A silicon-containing insulating film is formed on a target substrate by CVD, in a process field to be selectively supplied with a purge gas, a first process gas containing a silane family gas, and a second process gas containing a gas selected from the group consisting of nitriding, oxynitriding, and oxidizing gases. This method alternately includes first to fourth steps. The first, second, third, and fourth steps perform supply of the first process gas, purge gas, second process gas, and purge gas, respectively, while stopping supply of the other two gases. The process field is continuously vacuum-exhausted over the first to fourth steps through an exhaust passage provided with an opening degree adjustment valve. An opening degree of the valve in the first step is set to be 5 to 95% of that used in the second and fourth steps.

18 Claims, 11 Drawing Sheets

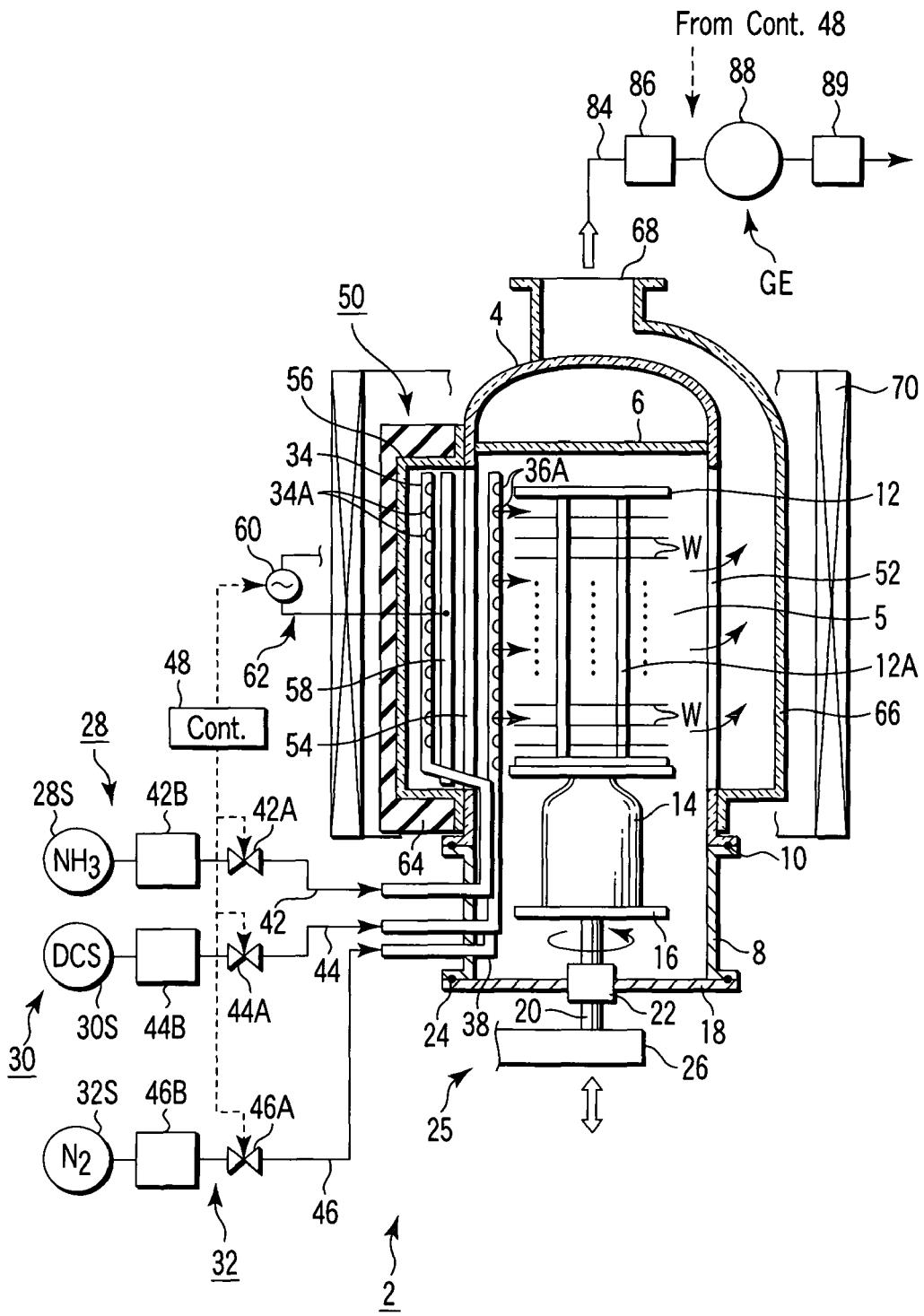
F I G. 1

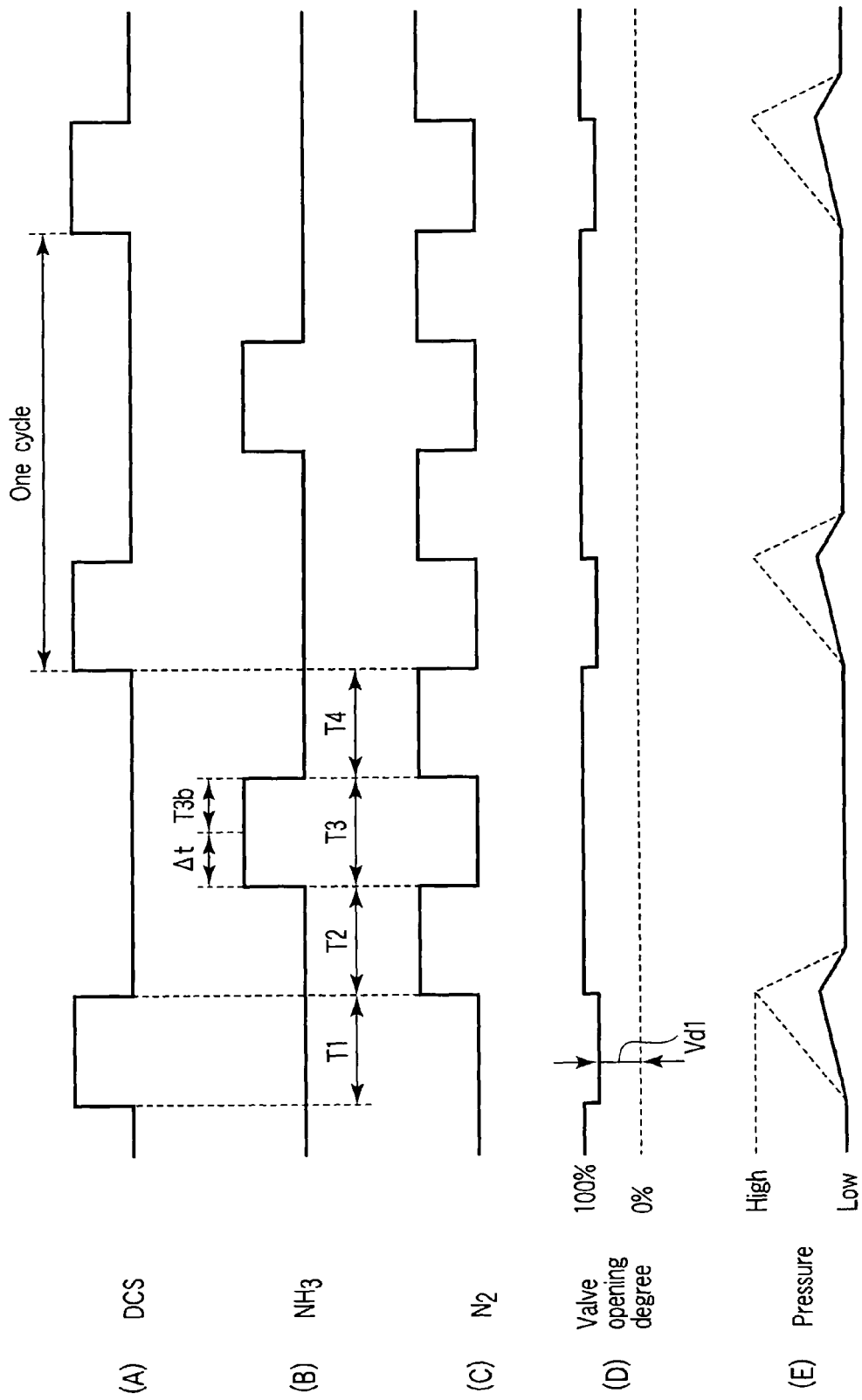
F I G. 8

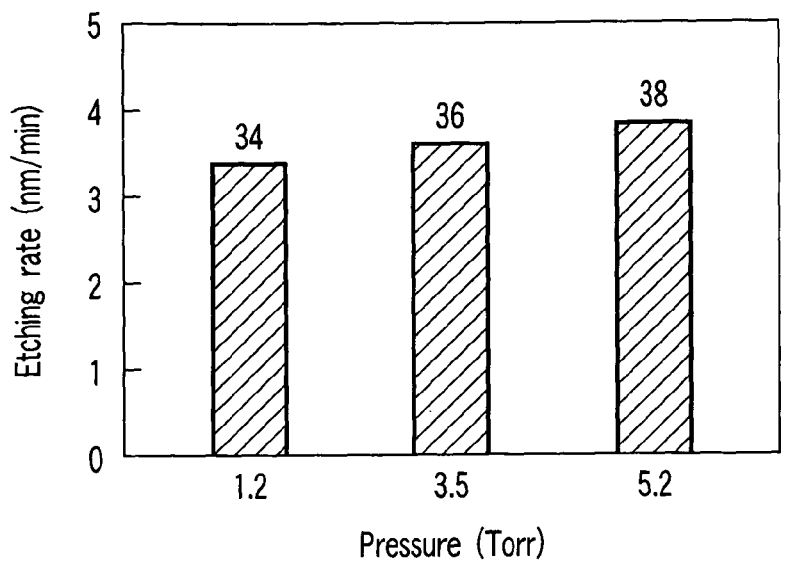
F I G. 9
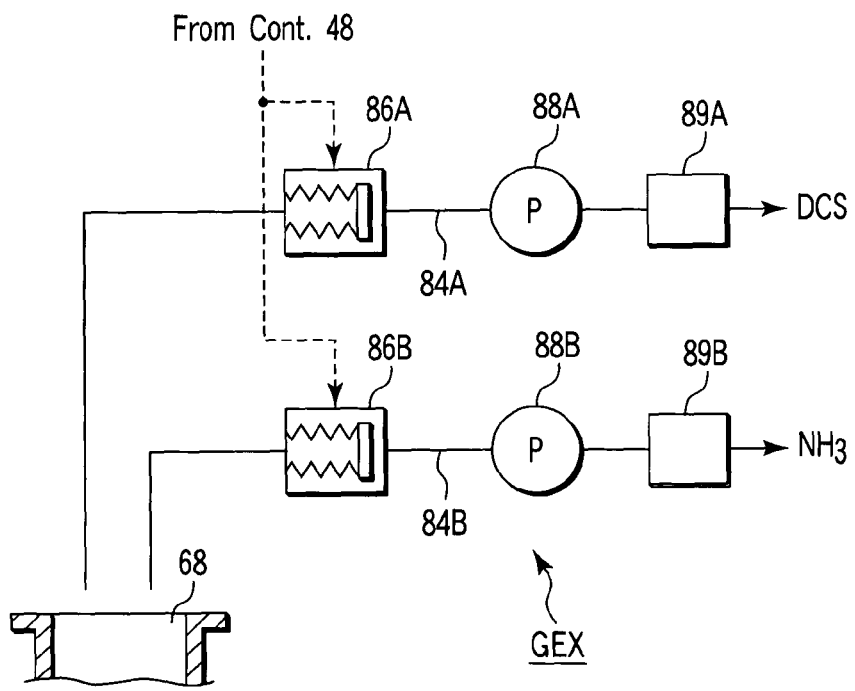
F I G. 10

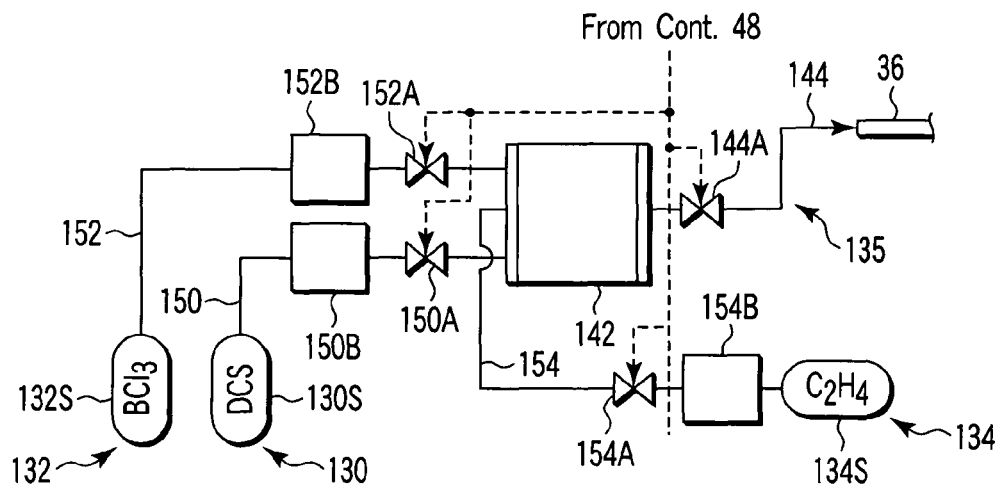
F I G. 12
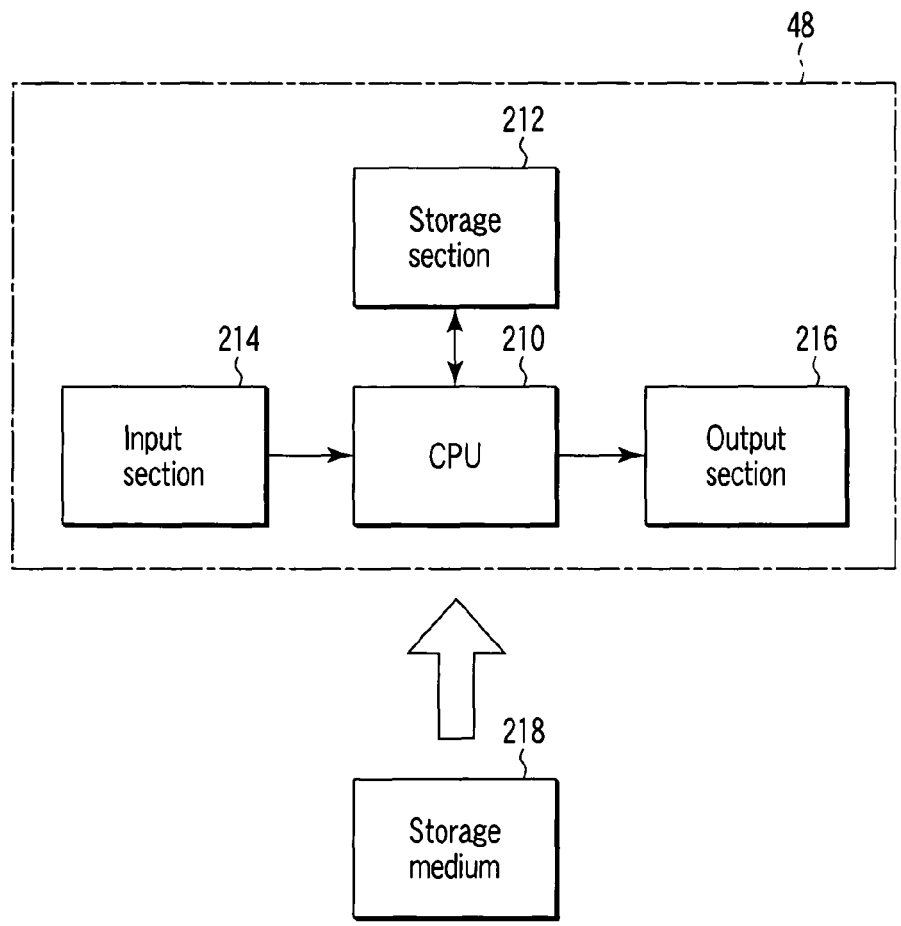
F I G. 13

METHOD AND APPARATUS FOR FORMING SILICON-CONTAINING INSULATING FILM

CROSS-REFERENCE TO RELATED APPLICATIONS

This application is based upon and claims the benefit of priority from prior Japanese Patent Application No. 2005-224741, filed Aug. 2, 2005, the entire contents of which are incorporated herein by reference.

BACKGROUND OF THE INVENTION

1. Field of the Invention

The present invention relates to a film formation method and apparatus for forming a silicon-containing insulating film on a target substrate, such as a semiconductor wafer, in, e.g., a semiconductor processing system. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an LCD (Liquid Crystal Display) or FPD (Flat Panel Display), by forming semiconductor layers, insulating layers, and conductive layers in predetermined patterns on the target substrate.

2. Description of the Related Art

In manufacturing semiconductor devices for constituting semiconductor integrated circuits, a target substrate, such as a semiconductor wafer, is subjected to various processes, such as film formation, etching, oxidation, diffusion, reformation, annealing, and natural oxide film removal. Jpn. Pat. Appln. KOKAI Publication No. 2002-60947 (Patent Document 1) discloses a semiconductor processing method of this kind performed in a vertical heat-processing apparatus (of the so-called batch type). According to this method, semiconductor wafers are first transferred from a wafer cassette onto a vertical wafer boat and supported thereon at intervals in the vertical direction. The wafer cassette can store, e.g., 25 wafers, while the wafer boat can support 30 to 150 wafers. Then, the wafer boat is loaded into a process container from below, and the process container is airtightly closed. Then, a predetermined heat-process is performed, while the process conditions, such as process gas flow rate, process pressure, and process temperature, are controlled.

Conventionally, silicon oxide films ($SiO_2$ films) are mainly used as insulating films for semiconductor devices. However, in recent years, owing to the demands of increased integration and miniaturization of semiconductor integrated circuits, silicon nitride films ($Si_3N_4$ films) are used in place of silicon oxide films, as usage. For example, silicon nitride films are disposed as films resistant to oxidation, films for preventing impurity diffusion, and sidewall films of gate electrode structures. Since silicon nitride films provide a low coefficient of impurity diffusion and a good barrier property against oxidation, they are very suitable as insulating films for the purpose described above.

In recent years, owing to the demands of increased miniaturization and integration of semiconductor integrated circuits, it is required to alleviate the thermal history of semiconductor devices in manufacturing steps, thereby improving the characteristics of the devices. For vertical processing apparatuses, it is also required to improve semiconductor processing methods in accordance with the demands described above. For example, there is a CVD process which performs film formation while intermittently supplying a source gas and so forth to repeatedly form layers each having an atomic or molecular level thickness, one by one, or several by several (for example, see Jpn. Pat. Appln. KOKAI Publication No. 2004-281853 (Patent Document 2)). In general, this film formation method is called ALD (Atomic layer Deposition), which allows a predetermined process to be performed without exposing wafers to a very high temperature. Further, the ALD film formation provides good step coverage, and thus is suitable for filling recess portions of semiconductor devices, such as inter-gate gaps, which have become narrower with increased miniaturization of the devices.

BRIEF SUMMARY OF THE INVENTION

An object of the present invention is to provide a film formation method and apparatus for forming a silicon-containing insulating film, which can suppress the particle generation without decreasing the process throughput.

According to a first aspect of the present invention, there is provided a film formation method for forming a silicon-containing insulating film on a target substrate by CVD, in a process field configured to be selectively supplied with a purge gas, a first process gas containing a silane family gas, and a second process gas containing a gas selected from the group consisting of a nitriding gas, an oxynitriding gas, and an oxidizing gas, the method alternately comprising:

a first step of performing supply of the first process gas to the process field, while stopping supply of the second process gas and the purge gas to the process field;

a second step of performing supply of the purge gas to the process field, while stopping supply of the first and second process gases to the process field;

a third step of performing supply of the second process gas to the process field, while stopping supply of the first process gas and the purge gas to the process field; and a fourth step of performing supply of the purge gas to the process field, while stopping supply of the first and second process gases to the process field, wherein the process field is continuously vacuum-exhausted over the first to fourth steps through an exhaust passage provided with an opening degree adjustment valve, and an opening degree of the valve in the first step is set to be 5 to 95% of an opening degree of the valve in the second and fourth steps.

According to a second aspect of the present invention, there is provided a film formation apparatus for forming a silicon-containing insulating film, the apparatus comprising:

a process container having a process field configured to accommodate a target substrate;

a support member configured to support the target substrate inside the process field;

a heater configured to heat the target substrate inside the process field;

an exhaust system configured to exhaust gas inside the process field through an exhaust passage provided with an opening degree adjustment valve;

a first process gas supply circuit configured to supply a first process gas containing a silane family gas to the process field;

a second process gas supply circuit configured to supply a second process gas containing a gas selected from the group consisting of a nitriding gas, an oxynitriding gas, and an oxidizing gas to the process field;

a purge gas supply circuit configured to supply a purge gas to the process field; and a control section configured to control an operation of the apparatus, wherein, in order to form a silicon-containing insulating film on the target substrate by CVD, the control section alternately executes a first step of performing supply of the first process gas to the process field, while stopping supply of the second process gas and the purge gas to the process field;

a second step of performing supply of the purge gas to the process field, while stopping supply of the first and second process gases to the process field;

a third step of performing supply of the second process gas to the process field, while stopping supply of the first process gas and the purge gas to the process field; and a fourth step of performing supply of the purge gas to the process field, while stopping supply of the first and second process gases to the process field, while continuously vacuum-exhausting the process field over the first to fourth steps through the exhaust passage, and setting an opening degree of the valve in the first step to be 5 to 95% of an opening degree of the valve in the second and fourth steps.

According to a third aspect of the present invention, there is provided a computer readable medium containing program instructions for execution on a processor, which is used for a film formation apparatus for forming a silicon-containing insulating film on a target substrate by CVD, in a process field configured to be selectively supplied with a purge gas, a first process gas containing a silane family gas, and a second process gas containing a gas selected from the group consisting of a nitriding gas, an oxynitriding gas, and an oxidizing gas, wherein the program instructions, when executed by the processor, cause the film formation apparatus to execute a first step of performing supply of the first process gas to the process field, while stopping supply of the second process gas and the purge gas to the process field;

a second step of performing supply of the purge gas to the process field, while stopping supply of the first and second process gases to the process field;

a third step of performing supply of the second process gas to the process field, while stopping supply of the first process gas and the purge gas to the process field; and a fourth step of performing supply of the purge gas to the process field, while stopping supply of the first and second process gases to the process field, while continuously vacuum-exhausting the process field over the first to fourth steps through an exhaust passage provided with an opening degree adjustment valve, and setting an opening degree of the valve in the first step to be 5 to 95% of an opening degree of the valve in the second and fourth steps.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is a sectional view showing a film formation apparatus (vertical CVD apparatus) according to an embodiment of the present invention;

FIG. 8 is a timing chart of the gas supply and exhaust passage opening degree of a film formation method according to a third embodiment of the present invention;

FIG. 9 is a graph showing the DCS pressure dependence of the wet etching rate of a film, obtained by a film formation process according to Present example 2 employed in Experiment 2;

FIG. 10 is a view showing the vacuum exhaust system of a film formation apparatus (vertical CVD apparatus) according to a fourth embodiment of the present invention;

FIG. 12 is a view showing the first, third, and fourth process gas supply circuits of a film formation apparatus (vertical CVD apparatus) according to a fifth embodiment of the present invention;

FIG. 13 is a block diagram schematically showing the structure of a main control section;

DETAILED DESCRIPTION OF THE INVENTION

In the process of developing the present invention, the inventors studied problems caused in conventional film formation apparatuses for a semiconductor process, as those disclosed in Patent Document 2 and so forth. As a result, the inventors have arrived at the findings given below.

Figure 14:
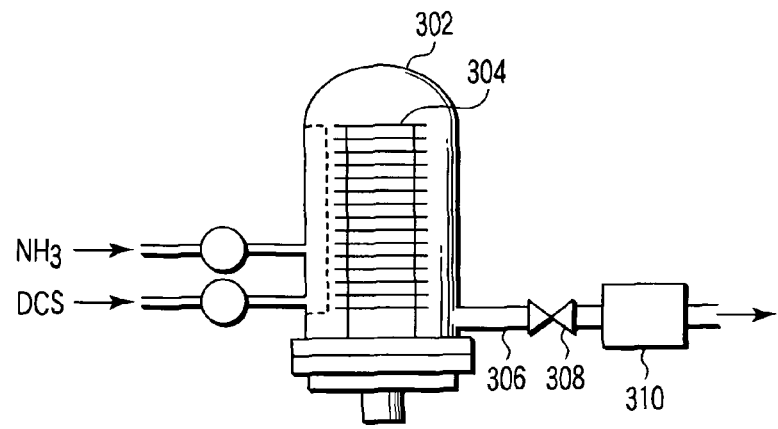
FIG. 14 is a view schematically showing a conventional vertical film formation apparatus disclosed in Patent Document 2.
Figure 15:
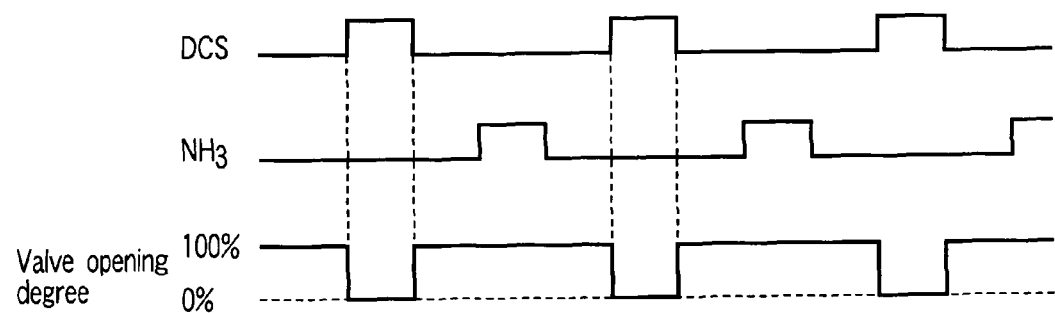
FIG. 15 is a timing chart of the gas supply and exhaust passage opening degree of a film formation method disclosed in Patent Document 2.

FIG. 14 is a view schematically showing a conventional vertical film formation apparatus disclosed in Patent Document 2. FIG. 15 is a timing chart of the gas supply and exhaust passage opening degree of a film formation method disclosed in Patent Document 2.

As shown in FIG. 14, this apparatus includes a process container 302, in which a plurality of semiconductor wafers W are stacked at intervals on a wafer boat 304. The process container 302 is connected to supply circuits of dichlorosilane (DCS: $SiH_2Cl_2$) gas and ammonia ($NH_3$) gas used as a silane family gas and a nitriding gas, respectively. Further, the process container 302 is connected to an exhaust system 306 including an exhaust valve 308 and a vacuum pump 310 in this order. During the process, as shown in FIG. 15, DCS gas and ammonia gas are alternately and intermittently supplied into the process container 302 with purge periods interposed therebetween. In this case, since DCS gas has a low vapor pressure, the exhaust valve 308 is fully closed when DCS gas is supplied. The pressure inside the process container 302 is thereby increased to facilitate adsorption of DCS gas onto the wafer surface (increase the adsorption amount).

However, according to the method described above, when the exhaust valve 308 is fully closed, the pressure inside the container 302 takes on an equilibrium state for a moment. At this time, micro-particles of reaction by-products, such as ammonium chloride, deposited on the inner wall of the exhaust system and so forth occasionally peel off and flow backward. Such micro-particles may fall onto the wafer surface and act as nuclei in generating particles.

The exhaust valve 308 can be formed of a so-called combination valve that functions as both a switching valve and a pressure regulating valve. In this case, when the exhaust valve 308 is fully closed, reaction by-products are deposited on a seal member, such as an O-ring, disposed in the combination valve. Consequently, the deposits may damage the sealing property of the seal member and bring about internal leakage. In order to solve this problem, the seal member may be heated to a temperature higher than the sublimation temperature of reaction by-products to prevent deposition of the reaction by-products. However, this countermeasure requires the exhaust valve 308 to be heat-resistant, which makes the valve structure complicated and thus impractical.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary.

Figure 2:
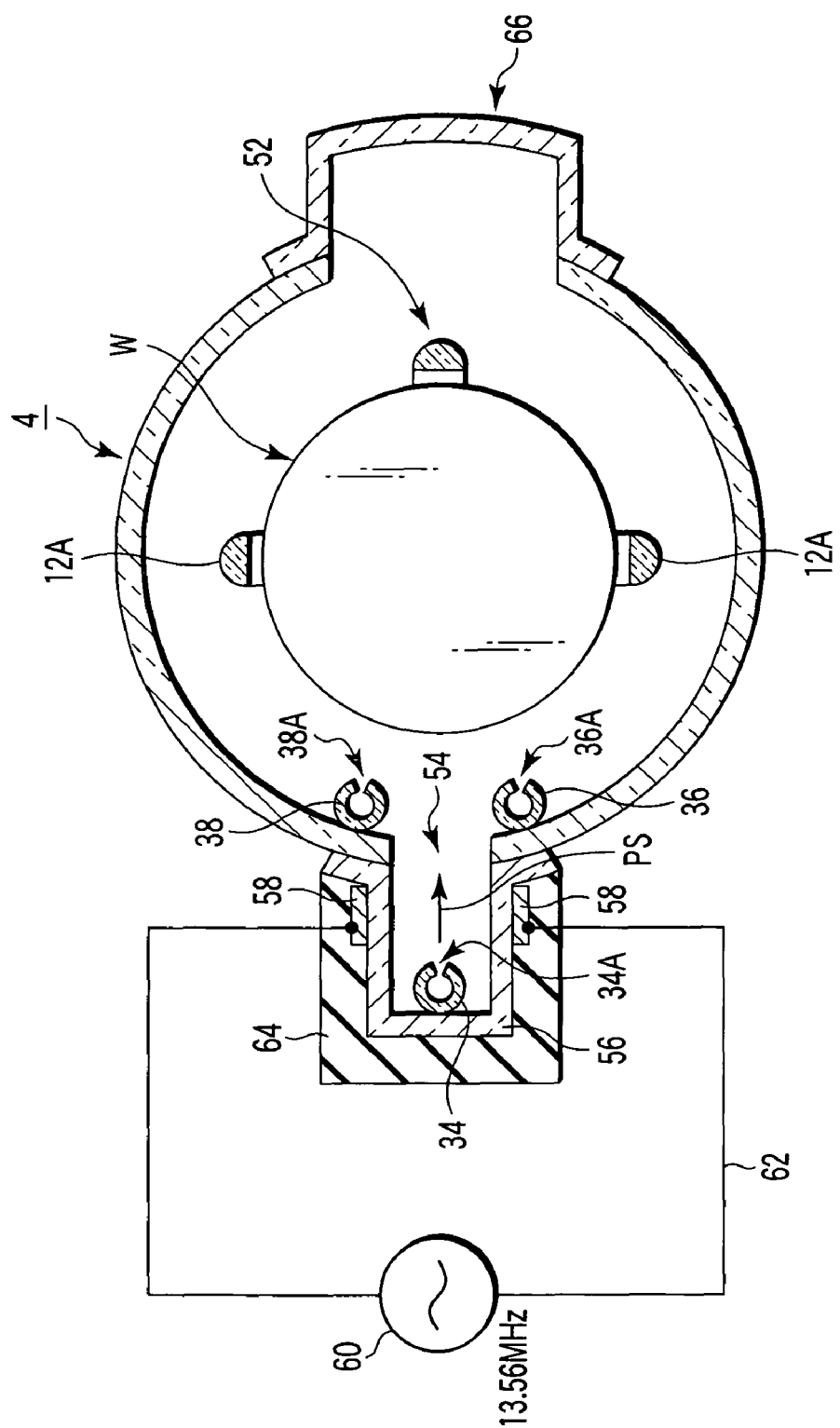
FIG. 2 is a sectional plan view showing part of the apparatus shown in FIG. 1.

FIG. 1 is a sectional view showing a film formation apparatus (vertical CVD apparatus) according to an embodiment of the present invention. FIG. 2 is a sectional plan view showing part of the apparatus shown in FIG. 1. The film formation apparatus 2 has a process field configured to be selectively supplied with a first process gas containing dichlorosilane (DCS) gas as a silane family gas, a second process gas containing ammonia ($NH_3$) gas as a nitriding gas, and a purge gas comprising an inactive gas, such as $N_2$ gas. The film formation apparatus 2 is configured to form a silicon nitride film on target substrates by CVD in the process field. Further, as described later, the process field may be further configured to be selectively supplied with one or both of a third process gas containing $BCl_3$ gas as a boron-containing gas and a fourth process gas containing $C_2H_4$ (ethylene) gas as a carbon hydride gas, as needed.

The apparatus 2 includes a process container 4 shaped as a cylindrical column with a ceiling and an opened bottom, in which a process field 5 is defined to accommodate and process a plurality of semiconductor wafers (target substrates) stacked at intervals. The entirety of the process container 4 is made of, e.g., quartz. The top of the process container 4 is provided with a quartz ceiling plate 6 to airtightly seal the top. The bottom of the process container 4 is connected through a seal member 10, such as an O-ring, to a cylindrical manifold 8. The process container may be entirely formed of a cylindrical quartz column without a manifold 8 separately formed.

The cylindrical manifold 8 is made of, e.g., stainless steel, and supports the bottom of the process container 4. A wafer boat 12 made of quartz is moved up and down through the bottom port of the manifold 8, so that the wafer boat 12 is loaded/unloaded into and from the process container 4. A number of target substrates or semiconductor wafers W are stacked on a wafer boat 12. For example, in this embodiment, the wafer boat 12 has struts 12A that can support, e.g., about 50 to 100 wafers having a diameter of 300 mm at essentially regular intervals in the vertical direction.

The wafer boat 12 is placed on a table 16 through a heat-insulating cylinder 14 made of quartz. The table 16 is supported by a rotary shaft 20, which penetrates a lid 18 made of, e.g., stainless steel, and is used for opening/closing the bottom port of the manifold 8.

The portion of the lid 18 where the rotary shaft 20 penetrates is provided with, e.g., a magnetic-fluid seal 22, so that the rotary shaft 20 is rotatably supported in an airtightly sealed state. A seal member 24, such as an O-ring, is interposed between the periphery of the lid 18 and the bottom of the manifold 8, so that the interior of the process container 4 can be kept sealed.

The rotary shaft 20 is attached at the distal end of an arm 26 supported by an elevating mechanism 25, such as a boat elevator. The elevating mechanism 25 moves the wafer boat 12 and lid 18 up and down integratedly. The table 16 may be fixed to the lid 18, so that wafers W are processed without rotation of the wafer boat 12.

A gas supply section is connected to the side of the manifold 8 to supply predetermined process gases to the process field 5 within the process container 4. Specifically, the gas supply section includes a second process gas supply circuit 28, a first process gas supply circuit 30, and a purge gas supply circuit 32. The first process gas supply circuit 30 is arranged to supply a first process gas containing a silane family gas, such as DCS (dichlorosilane) gas. The second process gas supply circuit 28 is arranged to supply a second process gas containing a nitriding gas, such as ammonia ($NH_3$) gas. The purge gas supply circuit 32 is arranged to supply an inactive gas, such as $N_2$ gas, as a purge gas. Each of the first and second process gases may be mixed with a suitable amount of carrier gas, as needed. However, such a carrier gas will not be mentioned, hereinafter, for the sake of simplicity of explanation.

More specifically, the second process gas supply circuit 28, first process gas supply circuit 30, and purge gas supply circuit 32 include gas distribution nozzles 34, 36, and 38, respectively, each of which is formed of a quartz pipe which penetrates the sidewall of the manifold 8 from the outside and then turns and extends upward (see FIG. 2). The gas distribution nozzles 34, 36, and 38 respectively have a plurality of gas spouting holes 34A, 36A, and 38A, each set being formed at predetermined intervals in the longitudinal direction (the vertical direction) over all the wafers W on the wafer boat 12. The gas spouting holes 34A, 36A, and 38A respectively deliver the second process gas (containing $NH_3$ gas), first process gas (containing DCS), and purge gas ($N_2$ gas) almost uniformly in the horizontal direction, so as to form gas flows parallel with the wafers W on the wafer boat 12.

The nozzles 34, 36, and 38 are connected to gas sources 28S, 30S, and 32S of $NH_3$ gas, DCS gas, and $N_2$ gas, respectively, through gas supply lines (gas passages) 42, 44, and 46, respectively. The gas supply lines 42, 44, and 46 are provided with switching valves 42A, 44A, and 46A and flow rate controllers 42B, 44B, and 46B, such as mass flow controllers, respectively. With this arrangement, $NH_3$ gas, DCS gas, and $N_2$ gas can be supplied at controlled flow rates.

A gas exciting section 50 is formed at the sidewall of the process container 4 in the vertical direction. On the side of the process container 4 opposite to the gas exciting section 50, a long and thin exhaust port 52 for vacuum-exhausting the inner atmosphere is formed by cutting the sidewall of the process container 4 in, e.g., the vertical direction.

Specifically, the gas exciting section 50 has a vertically long and thin opening 54 formed by cutting a predetermined width of the sidewall of the process container 4, in the vertical direction. The opening 54 is covered with a quartz cover 56 airtightly connected to the outer surface of the process container 4 by welding. The cover 56 has a vertically long and thin shape with a concave cross-section, so that it projects outward from the process container 4.

With this arrangement, the gas exciting section 50 is formed such that it projects outward from the sidewall of the process container 4 and is opened on the other side to the interior of the process container 4. In other words, the inner space of the gas exciting section 50 communicates with the process field 5 within the process container 4. The opening 54 has a vertical length sufficient to cover all the wafers W on the wafer boat 12 in the vertical direction.

A pair of long and thin electrodes 58 are disposed on the opposite outer surfaces of the cover 56, and face each other while extending in the longitudinal direction (the vertical direction). The electrodes 58 are connected to an RF (Radio Frequency) power supply 60 for plasma generation, through feed lines 62. An RF voltage of, e.g., 13.56 MHz is applied to the electrodes 58 to form an RF electric field for exciting plasma between the electrodes 58. The frequency of the RF voltage is not limited to 13.56 MHz, and it may be set at another frequency, e.g., 400 kHz.

The gas distribution nozzle 34 of the second process gas is bent outward in the radial direction of the process container 4, at a position lower than the lowermost wafer W on the wafer boat 12. Then, the gas distribution nozzle 34 vertically extends at the deepest position (the farthest position from the center of the process container 4) in the gas exciting section 50. As shown also in FIG. 2, the gas distribution nozzle 34 is separated outward from an area sandwiched between the pair of electrodes 58 (a position where the RF electric field is most intense), i.e., a plasma generation area PS where the main plasma is actually generated. The second process gas containing $NH_3$ gas is spouted from the gas spouting holes 34A of the gas distribution nozzle 34 toward the plasma generation area PS. Then, the second process gas is excited (decomposed or activated) in the plasma generation area PS, and is supplied in this state onto the wafers W on the wafer boat 12.

An insulating protection cover 64 made of, e.g., quartz is attached to and covers the outer surface of the cover 56. A cooling mechanism (not shown) is disposed in the insulating protection cover 64 and comprises coolant passages respectively facing the electrodes 58. The coolant passages are supplied with a coolant, such as cooled nitrogen gas, to cool the electrodes 58. The insulating protection cover 64 is covered with a shield (not shown) disposed on the outer surface to prevent RF leakage.

The gas distribution nozzles 36 and 38 of the first process gas and purge gas extend upward and face each other at positions near and outside the opening 54 of the gas exciting section 50, i.e., on both sides of the outside of the opening 54 (in the process container 4). The first process gas containing DCS gas and the purge gas consisting of $N_2$ gas are spouted from the gas spouting holes 36A and 38A of the gas distribution nozzles 36 and 38, respectively, toward the center of the process container 4.

On the other hand, the exhaust port 52, which is formed opposite the gas exciting section 50, is covered with an exhaust port cover member 66. The exhaust port cover member 66 is made of quartz with a U-shape cross-section, and attached by welding. The exhaust cover member 66 extends upward along the sidewall of the process container 4, and has a gas outlet 68 at the top of the process container 4. The gas outlet 68 is connected to a vacuum-exhaust system GE including a vacuum pump and so forth.

The process container 4 is surrounded by a heater 70, which is used for heating the atmosphere within the process container 4 and the wafers W. A thermocouple (not shown) is disposed near the exhaust port 52 in the process container 4 to control the heater 70.

Figure 3:
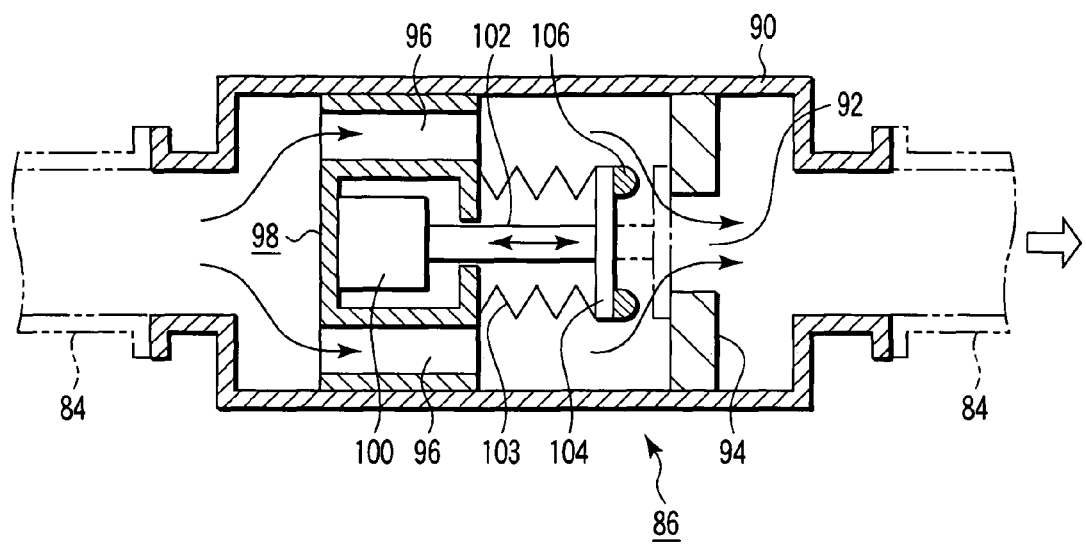
FIG. 3 is a sectional side view showing a valve unit (an opening degree adjustment valve) used in the exhaust system of the apparatus shown in FIG. 1.
Figure 4:
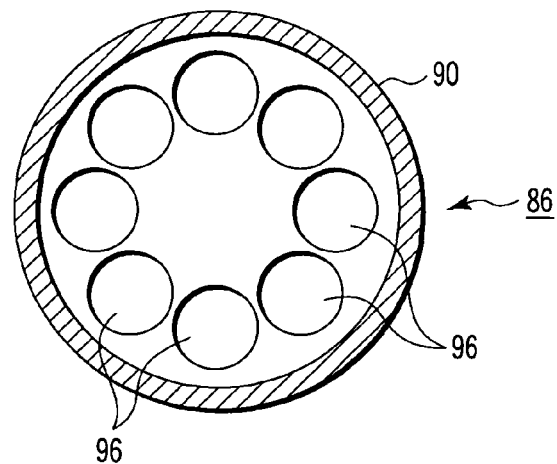
FIG. 4 is a sectional front view of the valve unit shown in FIG. 3.

The vacuum exhaust system GE has an exhaust passage 84 connected to the gas outlet 68, on which a valve unit (an opening degree adjustment valve) 86, a vacuum pump 88, and a detoxification unit 89 for removing undesirable substances are disposed in this order from the upstream side. The valve unit 86 is formed of a so-called combination valve that functions as both a switching valve and a pressure regulating valve. In other words, the valve unit 86 can set its valve opening degree at an arbitral value including fully open and fully closed states. FIGS. 3 and 4 are a sectional side view and a sectional front view showing the valve unit 86.

As shown in FIGS. 3 and 4, the valve unit 86 includes a cylindrical valve casing 90 disposed on the exhaust passage 84. A valve seat 94 with a valve port 92 is disposed inside the valve casing 90. A valve drive portion 98 is disposed upstream from the valve seat 94 and includes an actuator 100 with a rod 102 extending downstream. The distal end of the rod 102 is connected to a valve body 104 configured to sit on the valve seat 94 to close the valve port 92. A flexible bellows 103 is disposed between the valve body 104 and valve drive portion 98 to surround the rod 102 and to protect the actuator 100. The valve body 104 is provided with a seal member 106, such as an O-ring, to airtightly close the valve port 92. A plurality of interconnecting passages 96 are disposed circularly around the valve drive portion 98 for exhaust gas to pass therethrough.

According to the valve unit 86, the valve body 104 is reciprocated to set the valve opening degree at an arbitral value including fully open and fully closed states. The valve body 104 can be heated to a predetermined temperature, such as about 150° C., to prevent reaction by-products from being deposited thereon. The structure of the valve unit 86 shown in FIGS. 3 and 4 is merely an example and is not limiting.

The film formation apparatus 2 further includes a main control section 48 formed of, e.g., a computer, to control the entire apparatus. The main control section 48 can control the film formation process described below in accordance with the process recipe of the film formation process concerning, e.g., the film thickness and composition of a film to be formed, stored in the memory thereof in advance. In the memory, the relationship between the process gas flow rates and the thickness and composition of the film is also stored as control data in advance. Accordingly, the main control section 48 can control the elevating mechanism 25, gas supply circuits 28, 30, and 32, exhaust system GE (including the valve unit 86), gas exciting section 50, heater 70, and so forth, based on the stored process recipe and control data.

Next, an explanation will be given of a film formation method (so called ALD (Atomic Layer Deposition) film formation) performed in the apparatus shown in FIG. 1. In summary, this film formation method is arranged to selectively supply a first process gas containing dichlorosilane (DCS) gas as a silane family gas and a second process gas containing ammonia ($NH_3$) gas as a nitriding gas to the process field 5 accommodating wafers W to form a silicon nitride film on the wafers W by CVD.

At first, the wafer boat 12 at room temperature, which supports a number of, e.g., 50 to 100, wafers having a diameter of 300 mm, is loaded into the process container 4 heated at a predetermined temperature. Then, the interior of the process container 4 is vacuum-exhausted and kept at a predetermined process pressure, and the wafer temperature is increased to a process temperature for film formation. At this time, the apparatus is in a waiting state until the temperature becomes stable. Then, the first process gas containing DCS gas, the second process gas containing $NH_3$ gas, and the purge gas consisting of $N_2$ gas are intermittently supplied from the respective gas distribution nozzles 36, 34, and 38 at controlled flow rates.

Specifically, the first process gas containing DCS gas is supplied from the gas spouting holes 36A of the gas distribution nozzle 36 to form gas flows parallel with the wafers W on the wafer boat 12. While being supplied, molecules of DCS gas and molecules and atoms of decomposition products generated by its decomposition are adsorbed on the wafers W.

On the other hand, the second process gas containing $NH_3$ gas is supplied from the gas spouting holes 34A of the gas distribution nozzle 34 to form gas flows parallel with the wafers W on the wafer boat 12. The second process gas is selectively excited and partly turned into plasma when it passes through the plasma generation area PS between the pair of electrodes 58. At this time, for example, radicals (activated species), such as $N^*$, $NH^*$, $NH_2^*$, and $NH_3^*$, are produced (the symbol [*] denotes that it is a radical). The radicals flow out from the opening 54 of the gas exciting section 50 toward the center of the process container 4, and are supplied into gaps between the wafers W in a laminar flow state.

The radicals react with molecules of DCS gas adsorbed on the surface of the wafers W, so that a silicon nitride film is formed on the wafers W. Alternatively, when DCS gas flows onto radicals adsorbed on the surface of the wafers W, the same reaction is caused, so a silicon nitride film is formed on the wafers W.

Immediately after the step of supplying the first process gas containing DCS gas, and immediately after the step of supplying the second process gas containing $NH_3$ gas, the purge gas consisting of $N_2$ gas is supplied into the process field 5. The purge gas is supplied from the gas spouting holes 38A of the gas distribution nozzle 38 to form gas flows parallel with the wafers W on the wafer boat 12. The purge gas flows thus formed serve to forcibly remove residual components within the process field 5, such as DCS gas and its decomposition products or $NH_3$ gas and its decomposition products.

When the film formation process is being performed, the process field 5 is continuously vacuum-exhausted by the vacuum exhaust system GE through the exhaust passage 84. During this process, the opening degree of the valve unit 86 disposed on the exhaust passage 84 is controlled such that the opening degree in the step of supplying the first process gas is set to be 5 to 95% of the opening degree in the step of supplying the purge gas.

First Embodiment

Figure 5:
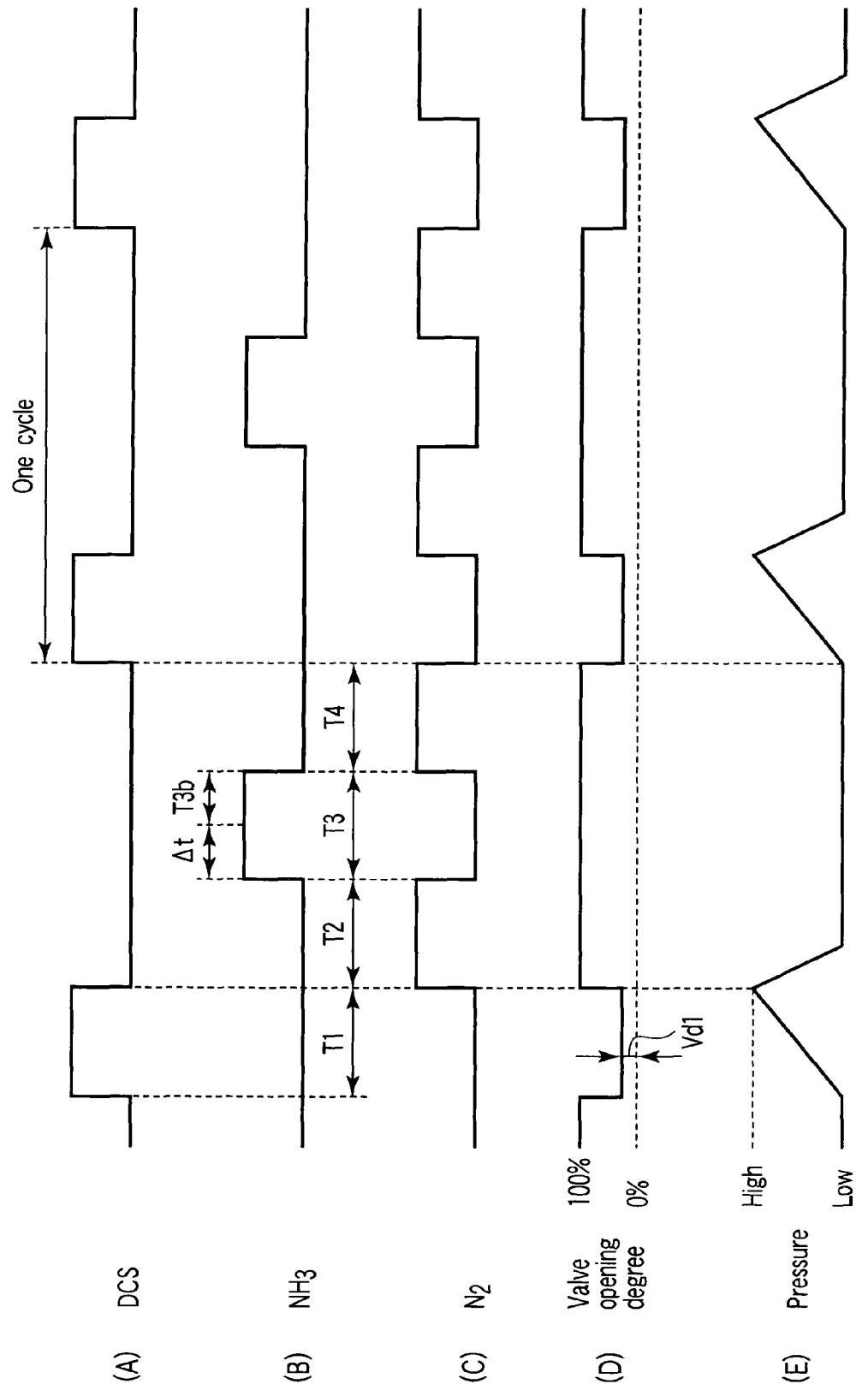
FIG. 5 is a timing chart of the gas supply and exhaust passage opening degree of a film formation method according to a first embodiment of the present invention.

FIG. 5 is a timing chart of the gas supply and exhaust passage opening degree of a film formation method according to a first embodiment of the present invention. As shown in FIG. 5, the film formation method according to this embodiment is arranged to alternately repeat first to fourth steps T1 to T4. A cycle comprising the first to fourth steps T1 to T4 is repeated a number of times, and thin films of silicon nitride formed by respective cycles are laminated, thereby arriving at a silicon nitride film having a target thickness.

Specifically, the first step T1 is arranged to perform supply of the first process gas (denoted as DCS in FIG. 5) to the process field 5, while stopping supply of the second process gas (denoted as $NH_3$ in FIG. 5) and the purge gas (denoted as $N_2$ in FIG. 5) to the process field 5. The second step T2 is arranged to perform supply of the purge gas to the process field 5, while stopping supply of the first and second process gases to the process field 5. The third step T3 is arranged to perform supply of the second process gas to the process field 5, while stopping supply of the first process gas and purge gas to the process field 5. Further, halfway through the third step T3, the RF power supply 60 is set in the ON state to turn the second process gas into plasma by the gas exciting section 50, so as to supply the second process gas in an activated state to the process field 5 during a sub-step T3b. The fourth step T4 is arranged to perform supply of the purge gas to the process field 5, while stopping supply of the first and second process gases to the process field 5.

Over the entirety of the first step T1 to the fourth step T4, the process field 5 is continuously vacuum-exhausted by the vacuum exhaust system GE through the exhaust passage 84. In the second and fourth steps T2 and T4, the opening degree of the valve unit 86 of the exhaust passage 84 is set at 100% (fully open). Consequently, the reactive gas remaining within the process field 5 can be swiftly removed by the purge gas. Also in the third step T3, the opening degree of the valve unit 86 of the exhaust passage 84 is set at 100% (fully open). Consequently, radicals derived from $NH_3$ are positively supplied onto the wafers W, so that they can promptly react with DCS gas molecules adsorbed on the wafers W (the film formation rate is increased).

On the other hand, in the first step T1, the opening degree of the valve unit 86 is set to be 5 to 20%. This valve opening degree is determined in consideration of the balance between promotion of DCS adsorption onto the wafers W and decrease in the number of particles present within the process field 5. Particularly, DCS gas has a low vapor pressure and thus is poor in being adsorbed onto the wafer surface. In order to aid adsorption of such a gas onto the wafer surface (to increase the adsorption amount), the first step is preferably arranged to use a higher pressure inside the process field 5. Accordingly, a decrease in the opening degree of the valve unit 86 is an important factor to increase the film formation rate so as to attain a higher process throughput. In this aspect, it is preferable to set the valve opening degree to be smaller in the first step.

On the other hand, in the first step T1, if the opening degree of the valve unit 86 is set at 0% (fully closed), various problems may arise concerning particles, as previously described. Accordingly, the opening degree of the valve unit 86 is set at a value within the range described above, so that a gas flow toward the exhaust system is always formed within the process field 5 even in the first step T1. In this case, for example, if deposits or the like on the inner wall of the exhaust system peel off due to pressure fluctuations, they cannot flow backward or fall onto the surface of the wafers W. Further, since the valve opening degree is not set at 0% (fully closed), reaction by-products, such as ammonium chloride, are prevented from being deposited onto the seal member 106 of the valve unit 86. Consequently, the valve unit 86 does not cause internal leakage due to the deposits. In these aspects, it is preferable to set the valve opening degree to be larger in the first step.

In light of the aspects described above, the first embodiment is arranged to use the opening degree of the valve unit 86 as a parameter to control the balance between promotion of DCS adsorption onto the wafers W and decrease in the number of particles present within the process field 5. Specifically, according to the first embodiment, the valve opening degree Vd1 in the first step is set to be 5 to 20% of the valve opening degree in the second and fourth steps, as described above. If the valve opening degree Vd1 is smaller than 5%, the effect becomes insufficient of exhausting particles and substances that act as nuclei in generating particles. If the valve opening degree Vd1 is larger than 20%, the adsorption efficiency of the first process gas onto the wafer surface becomes less than the acceptable range.

In the first step T1, since the opening degree of the valve unit 86 is set to be smaller, the pressure inside the process field 5 gradually increases from the minimum value (denoted as Low in FIG. 5) to the maximum value (denoted as High in FIG. 5). However, in the second step T2, since the opening degree of the valve unit 86 is set at 100%, the pressure gradually returns from the maximum value to the minimum value.

In FIG. 5, the first step T1 is set to be within a range of about 1 to 120 seconds, and, for example, at about 5 seconds. The second step T2 is set to be within a range of about 1 to 30 seconds, and, for example, at about 5 seconds. The third step T3 is set to be within a range of about 1 to 120 seconds, and, for example, at about 10 seconds. The sub-step T3b is set to be within a range of about 1 to 120 seconds, and, for example, at about 8 seconds. The fourth step T4 is set to be within a range of about 1 to 30 seconds, and, for example, at about 5 seconds. In general, the film thickness obtained by one cycle of the first to fourth steps T1 to T4 is about 0.05 to 0.11 nm. Accordingly, for example, where the target film thickness is 70 nm, the cycle is repeated about 600 times. However, these values of time and thickness are merely examples and thus are not limiting.

In the third step T3, the RF power supply 60 is turned on after a predetermined time Δt passes, to turn the second process gas into plasma by the gas exciting section 50, so as to supply the second process gas in an activated state to the process field 5 during the sub-step T3b. The predetermined time Δt is defined as the time necessary for stabilizing the flow rate of $NH_3$ gas, which is set at, e.g., about 1 seconds. However, the second process gas may be turned into plasma by the gas exciting section 50 over the entire period of supplying the second process gas. Since the RF power supply is turned on to generate plasma after the flow rate of the second process gas is stabilized, the uniformity of radical concentration among the wafers W (uniformity in the vertical direction) is improved.

The process conditions of the film formation process are as follows. The flow rate of DCS gas is set to be within a range of 50 to 2,000 sccm, e.g., at 1,000 sccm (1 slm). The flow rate of $NH_3$ gas is set to be within a range of 100 to 5,000 sccm, e.g., at 3,000 sccm. The flow rate of $N_2$ gas is set to be within a range of 300 to 5,000 sccm, e.g., at 3,000 sccm. The process temperature is lower than ordinary CVD processes, and is set to be within a range of 250 to 700° C., and preferably a range of 350 to 600° C. If the process temperature is lower than 250° C., essentially no film is deposited because hardly any reaction is caused. If the process temperature is higher than 700° C., a low quality CVD film is deposited, and existing films, such as a metal film, may suffer thermal damage.

The process pressure is set such that the minimum value (denoted as Low in FIG. 5) is within a range of 0 to 5 Torr, and preferably of 0 to 1 Torr. The maximum value (denoted as High in FIG. 5) is within a range of 0.1 to 10 Torr, and preferably of 0.1 to 5 Torr. It should be noted that 1 Torr=133.3 Pa. For example, the process pressure is set at 1 Torr during the first step (adsorption step) T1, and at 0.3 Torr during the third step (nitridation step using plasma) T3. If the process pressure is lower than 0.1 Torr, the film formation rate becomes lower than the practical level. If the process pressure is higher than 10 Torr, it becomes difficult to generate sufficient plasma.

<Experiment 1>

Using the apparatus shown in FIG. 1, a silicon nitride film was formed, and particle generation caused by the film formation was examined. As Present example 1, the film formation was performed using the timing chart shown in FIG. 5 according to the first embodiment. In Present example 1, the process conditions of the film formation were set with reference to those described above in the first embodiment. As Comparative example 1, the film formation was performed under the same process conditions as those of Present example 1, except that the valve opening degree of the exhaust system was set at 0% in the first step. In Present example 1 and Comparative example 1, the number of particles on wafers was counted every time one film formation process was performed.

Figure 6:
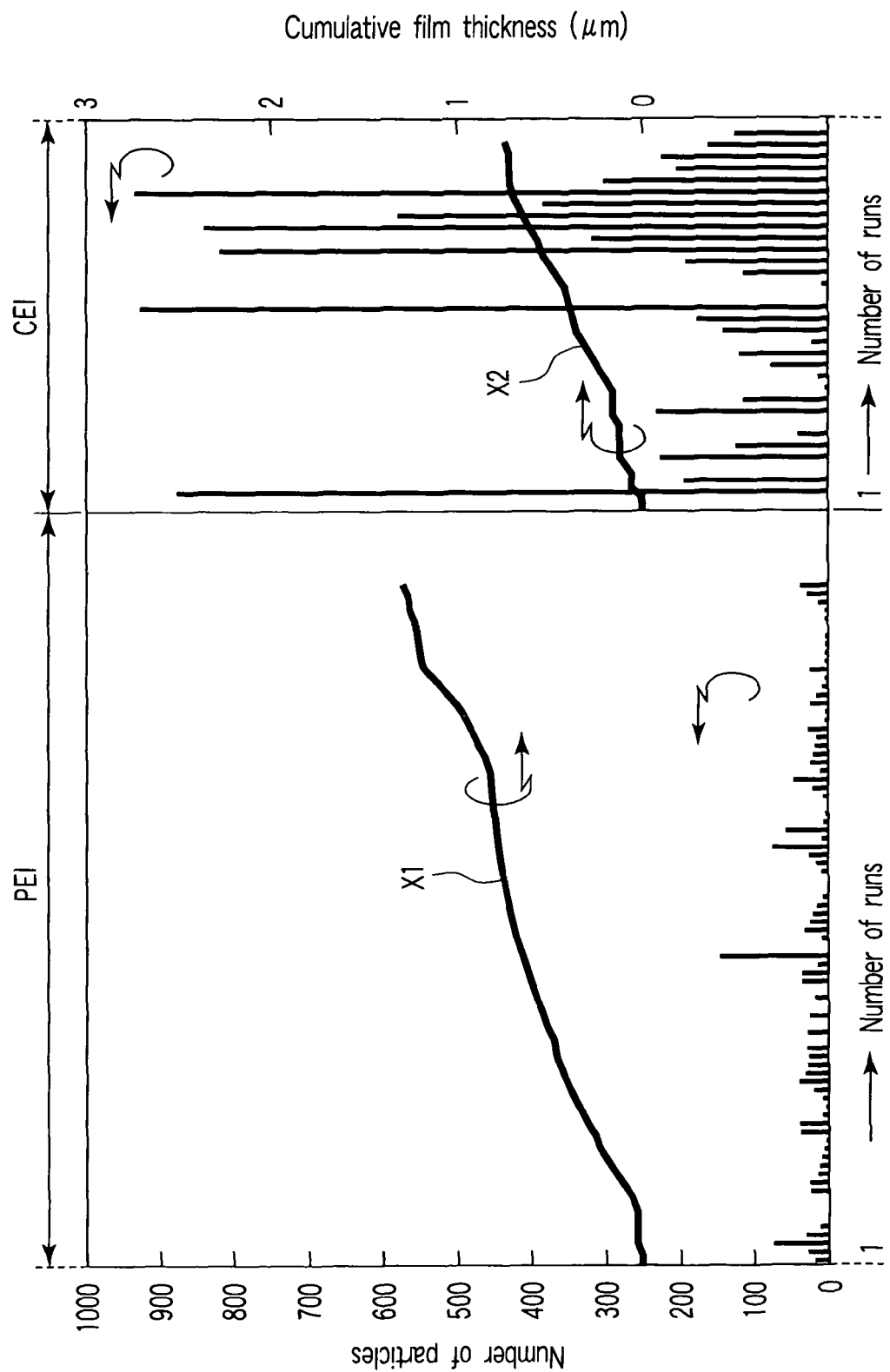
FIG. 6 is a graph showing the particle generation inside a process container, obtained by film formation processes according to Present example 1 (PE1) and Comparative example 1 (CE1) employed in Experiment 1.

FIG. 6 is a graph showing the particle generation inside the process container, obtained by the film formation processes according to Present example 1 (PE1) and Comparative example 1 (CE1) employed in Experiment 1. In FIG. 6, the left side shows the data of Present example 1 (PE1), and the right side shows the data of Comparative example 1 (CE1). The horizontal axis denotes the number of wafer processes (the number of runs). The left vertical axis denotes the number of particles. The right vertical axis denotes a cumulative film thickness (μm) formed on wafers. In the graph, curved lines X1 and X2 represent the cumulative film thickness, and vertical bars represent the number of particles.

As shown in FIG. 6, in the case of Comparative example 1 (CE1), a very large number of particles were undesirably generated with considerable frequency, which was accidental irrelevantly to the number of runs. On the other hand, in the case of Present example 1 (PE1), the number of particles generated was far lower than Comparative example 1, and stable at low values. Accordingly, it has been confirmed that the film formation method according to the first embodiment can provide a good result without accidental generation of a large number of particles.

Second Embodiment

Figure 7:
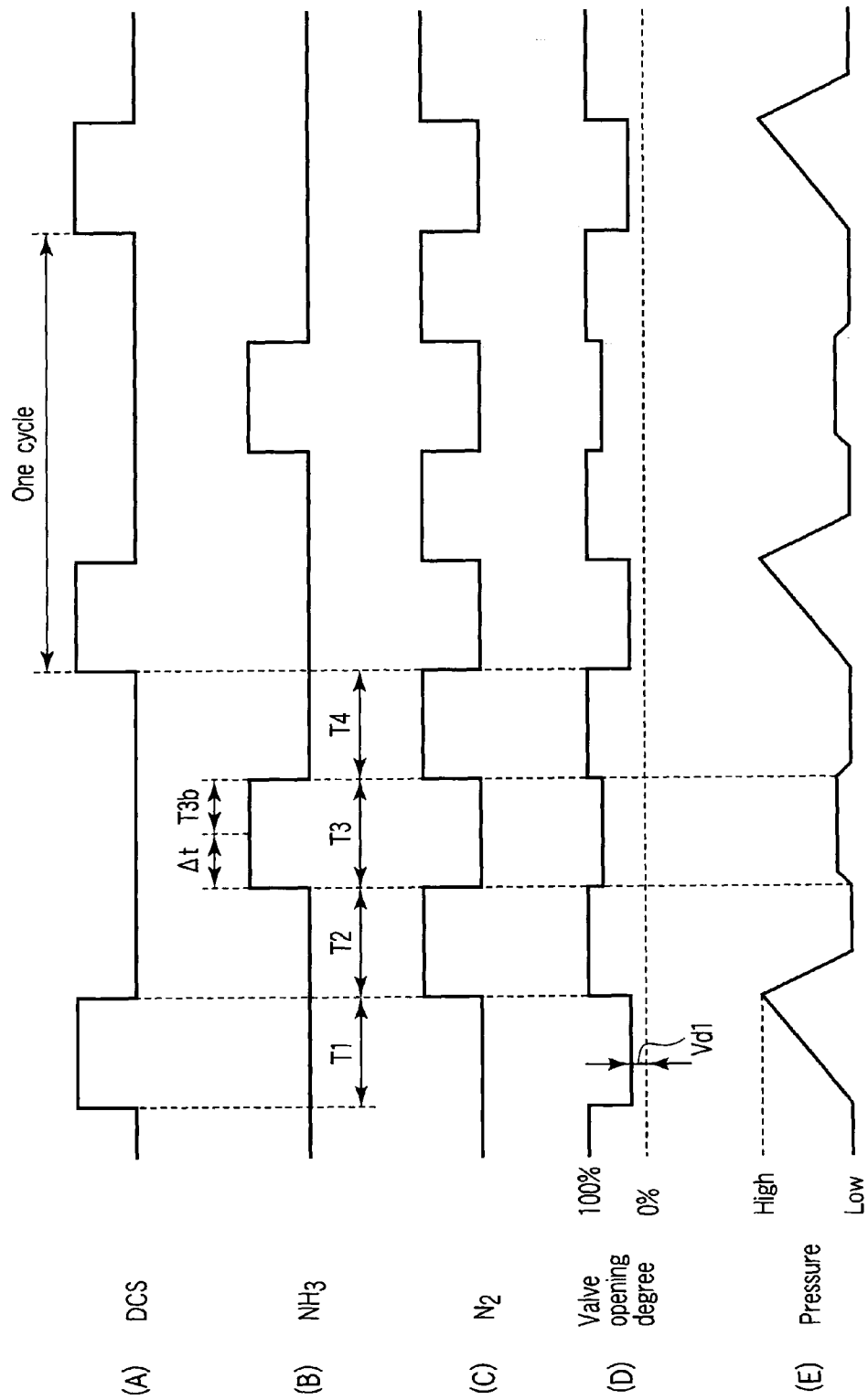
FIG. 7 is a timing chart of the gas supply and exhaust passage opening degree of a film formation method according to a second embodiment of the present invention.

FIG. 7 is a timing chart of the gas supply and exhaust passage opening degree of a film formation method according to a second embodiment of the present invention. The timing chart shown in FIG. 5 is arranged such that the opening degree of the valve unit 86 of the exhaust passage 84 is set at 100% (fully open) in the third step T3 of supplying $NH_3$ gas. In this respect, the timing chart shown in FIG. 7 is arranged such that the opening degree of the valve unit 86 of the exhaust passage 84 is set to be slightly smaller than 100% (fully open) in the third step T3 of supplying $NH_3$ gas. Consequently, the pressure inside the process field 5 can be controlled to improve and optimize the density of radicals derived from $NH_3$, as needed in a process.

Third Embodiment

FIG. 8 is a timing chart of the gas supply and exhaust passage opening degree of a film formation method according to a third embodiment of the present invention. The third embodiment is arranged to use the opening degree of the valve unit 86 as a parameter to control one or both of the stress in a silicon nitride film generated by a film formation process, and the potential etching rate of the silicon nitride film. Specifically, according to third embodiment, the valve opening degree Vd1 in the first step is set to be 80 to 95% of the valve opening degree in the second and fourth steps. With this arrangement, the pressure inside the process field 5 is controlled to increase only slightly in the first step, so as to improve the stress in and/or etching rate of the silicon nitride film.

<Experiment 2>

Using the apparatus shown in FIG. 1, a silicon nitride film was formed, and the etching rate thereof was examined. As Present example 2, the film formation was performed to form a silicon nitride film, using the timing chart shown in FIG. 8 according to the third embodiment, and the film thus formed was subjected to wet etching. In Present example 2, the process conditions of the film formation were set with reference to those described above in the first embodiment. Specifically, the RF power was set at 250 watts (in supplying $NH_3$), and the film formation temperature was set at 400° C. The pressure inside the process field 5 in the first step T1 of supplying DCS gas was set at different three values of 1.2 Torr, 3.5 Torr, and 5.2 Torr (ultimate pressure values). Further, to perform the wet etching, a wafer with the silicon nitride film thus formed was immersed in 0.1%-DHF (diluted HF) for 60 seconds.

FIG. 9 is a graph showing the DCS pressure dependence of the wet etching rate of the film, obtained by the film formation process according to Present example 2 employed in Experiment 2. In FIG. 9, the horizontal axis denotes the process pressure (Torr) during the DCS supply. The vertical axis denotes the etching rate of the film obtained by the wet etching. As shown in FIG. 9, it has been confirmed that, where the pressure is changed within a range of 1.2 to 5.2 Torr in the first step, the etching rate is adjusted within a range of 3.4 to 3.8 nm/min.

Fourth Embodiment

FIG. 10 is a view showing the vacuum exhaust system of a film formation apparatus (vertical CVD apparatus) according to a fourth embodiment of the present invention. In the apparatus shown in FIG. 1, the vacuum exhaust system GE includes only one exhaust passage 84. In this case, reaction by-products, such as ammonium chloride, may be generated in the vacuum exhaust system GE and block up the exhaust system. In this respect, as shown in FIG. 10, the vacuum exhaust system GEX according to the fourth embodiment is arranged such that the first process gas containing DCS and the second process gas containing $NH_3$ are respectively exhausted through a first exhaust system and a second exhaust system, which are exclusively used.

Specifically, the first exhaust system and second exhaust system respectively include an exhaust passage 84A and an exhaust passage 84B disposed in parallel. The exhaust passages 84A and 84B are provided with valve units (opening degree adjustment valves) 86A and 86B, vacuum pumps 88A and 88B, and detoxification units 89A and 89B, respectively, disposed in this order and having the same structures as those of the corresponding members of the vacuum exhaust system GE described above. The first exhaust passage 84A is used to mainly exhaust the first process gas (DCS) and the other gas supplied simultaneously therewith. The second exhaust passage 84B is used to mainly exhaust the second process gas ($NH_3$) and the other gas supplied simultaneously therewith.

The total valve opening degree of the two valve units 86A and 86B disposed on the exhaust passages 84A and 84B is controlled as an opening degree of one valve equivalent thereto. In other words, the main control section 48 controls the total valve opening degree of the two valve units 86A and 86B to agree with the valve opening degree of the valve unit 86 described above, so as to perform the film formation method corresponding to FIG. 5, 7, or 8.

Figure 11:
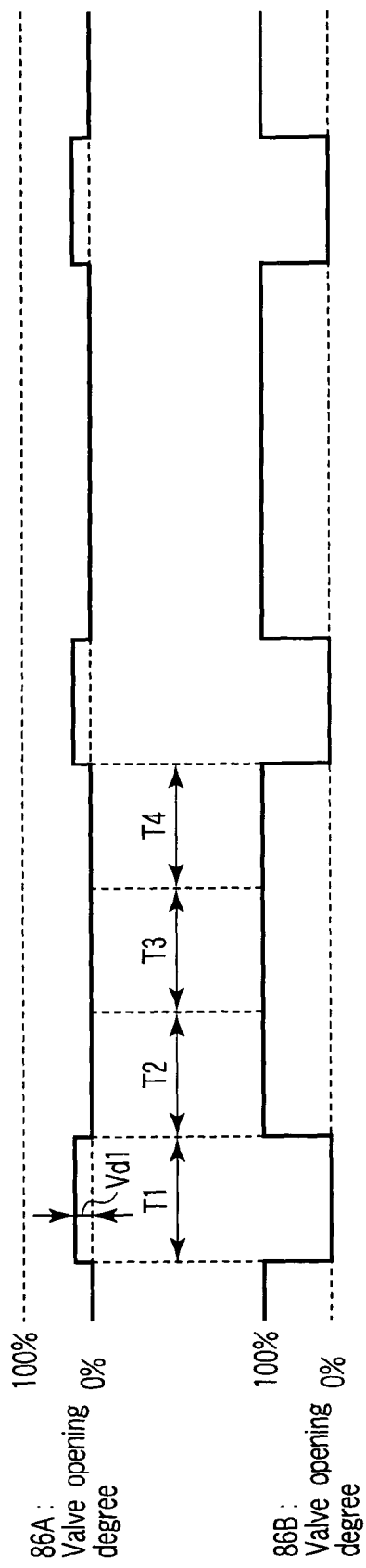
FIG. 11 is a timing chart of the exhaust passage opening degree of a film formation method according to the fourth embodiment.

FIG. 11 is a timing chart of the exhaust passage opening degree of a film formation method according to the fourth embodiment. The following valve operation is equivalent to the operation of the valve unit 86 shown in FIG. 5 according to the first embodiment, as an example. Accordingly, the other manners not shown in FIG. 11, such as gas supply manners, are the same as those shown in FIG. 5. As shown in FIG. 11, the valve unit 86A for the first process gas is repeatedly switched between a state set at a valve opening degree Vd1 and a state set to be fully closed. The other valve unit 86B for the second process gas is repeatedly switched between a state set to be fully open and a state set to be fully closed.

Specifically, in the first step T1, the valve unit 86A is set at the valve opening degree Vd1 so as for the first process gas to flow therethrough, while the other valve unit 86B is set at 0% (fully closed). In the third step T3, the valve unit 86A is set at 0% (fully closed), while the valve unit 86B is set at 100% (fully open) so as for the second process gas to flow therethrough. Consequently, the first process gas and second process gas are caused to respectively flow through the exhaust passages 84A and 84B separate from each other. Since the two gases are not mixed in the exhaust system, no reaction by-product is generated or block up the vacuum exhaust system GEX.

Fifth Embodiment

FIG. 12 is a view showing the first, third, and fourth process gas supply circuits of a film formation apparatus (vertical CVD apparatus) according to a fifth embodiment of the present invention. According to the fifth embodiment, the first step T1 is arranged to supply a doping gas along with the first process gas containing DCS into the process field 5. The doping gas comprises one or both of a third process gas containing a boron-containing gas ($BCl_3$ gas in this example) and a fourth process gas containing ethylene gas ($C_2H_4$ gas). The fifth embodiment is exemplified by a case where both of the third and fourth process gases are used. In this case, a thin film to be formed is an insulating film of SiBCN (boron doped silicon carbon nitride), i.e., containing boron and carbon.

As shown in FIG. 12, the first, third, and fourth process gas supply circuits 130, 132, and 134 are connected to a common mixture gas supply circuit 135. The mixture gas supply circuit 135 has a gas mixture tank 142 configured to mix the first, third, and fourth process gases. The gas mixture tank 142 is designed to have a volume for uniformly mixing the gases and temporarily store a sufficient supply amount of the mixture gas, such as a volume of, e.g., about four liters (to be changed depending on the gas flow rate). The gas mixture tank 142 is connected to a gas distribution nozzle 36 (see FIG. 1) formed of a quartz pipe through a mixture gas supply line 144 provided with a switching valve 144A.

The gas mixture tank 142 is connected to gas sources 130S, 132S, and 134S of DCS gas, $BCl_3$ gas, and $C_2H_4$ gas, respectively, through gas supply lines (gas passages) 150, 152, and 154 of the first, third, and fourth process gas supply circuits 130, 132, and 134, respectively. The gas supply lines 150, 152, and 154 are provided with switching valves 150A, 152A, and 154A and flow rate controllers 150B, 152B, and 154B, such as mass flow controllers, respectively. With this arrangement, DCS gas, $BCl_3$ gas, and $C_2H_4$ gas can be supplied at controlled flow rates.

Typically, the mixture gas may be formed and supplied by either of the following two modes. The first mode comprises continuously supplying the first, third, and fourth process gases from the first, third, and fourth process gas supply circuits 130, 132, and 134 into the gas mixture tank 142, while supplying the mixture gas pulse-wise from the gas mixture tank 142 into the process field 5 (see FIG. 1). The second mode comprises simultaneously supplying the first, third, and fourth process gases pulse-wise in a first phase from the first, third, and fourth process gas supply circuits 130, 132, and 134 into the gas mixture tank 142, while supplying the mixture gas pulse-wise in a second phase reverse to the first phase from the gas mixture tank 142 into the process field 5.

In order to realize these modes, the switching valves 150A, 152A, and 154A of the first, third, and fourth process gas supply circuits 130, 132, and 134 and the switching valve 144A of the mixture gas supply circuit 135 are opened and closed in accordance with instructions from the main control section 48, as follows. In the first mode, over a plurality of cycles from the start to the end of the film formation process, the switching valves 150A, 152A, and 154A are kept open while the switching valve 144A is opened and closed pulse-wise. In the second mode, over a plurality of cycles from the start to the end of the film formation process, the switching valves 150A, 152A, and 154A are opened and closed pulse-wise while the switching valve 144A is closed and opened pulse-wise in the reverse phase.

Common Matters and Modifications of First to Fifth Embodiments

Each of the methods according to the first to fifth embodiments is performed under the control of the main control section 48 in accordance with a process program, as described above. FIG. 13 is a block diagram schematically showing the structure of the main control section 48. The main control section 48 includes a CPU 210, which is connected to a storage section 212, an input section 214, and an output section 216. The storage section 212 stores process programs and process recipes. The input section 214 includes input devices, such as a keyboard, a pointing device, and a storage media drive, to interact with an operator. The output section 216 outputs control signals for controlling components of the processing apparatus. FIG. 13 also shows a storage medium 218 attached to the computer in a removable state.

Each of the methods according to the first to fifth embodiments may be written as program instructions for execution on a processor, into a computer readable storage medium or media to be applied to a semiconductor processing apparatus. Alternately, program instructions of this kind may be transmitted by a communication medium or media and thereby applied to a semiconductor processing apparatus. Examples of the storage medium or media are a magnetic disk (flexible disk, hard disk (a representative of which is a hard disk included in the storage section 212), etc.), an optical disk (CD, DVD, etc.), a magneto-optical disk (MO, etc.), and a semiconductor memory. A computer for controlling the operation of the semiconductor processing apparatus reads program instructions stored in the storage medium or media, and executes them on a processor, thereby performing a corresponding method, as described above.

In the first to fifth embodiments, for example, the first process gas contains DCS gas as a silane family gas. In this respect, the silane family gas may be one or more gases selected from the group consisting of dichlorosilane (DCS), hexachlorodisilane (HCD), monosilane ($SiH_4$), disilane ($Si_2Cl_6$), hexamethyldisilazane (HMDS), tetrachlorosilane (TCS), disilylamine (DSA), trisilylamine (TSA), bistertial-butylaminosilane (BTBAS).

In the first to fifth embodiments, the second process gas contains a nitriding gas, which may be ammonia ($NH_3$) gas or nitrogen ($N_2$) gas. Where the present invention is applied to formation of a silicon oxynitride film, an oxynitriding gas, such as dinitrogen oxide ($N_2O$) or nitrogen oxide (NO), may be used in place of the nitriding gas. Where the present invention is applied to formation of a silicon oxide film, an oxidizing gas, such as oxygen ($O_2$) or ozone ($O_3$), may be used in place of the nitriding gas.

In the fifth embodiment, the boron-containing gas used for doping with boron is exemplified by $BCl_3$ gas. In this respect, the boron-containing gas may be one or more gases selected from the group consisting of $BCl_3$, $B_2H_6$, $BF_3$, and $B(CH_3)_3$.

In the first to fifth embodiments, the exciting section 50 for generating plasma of the film formation apparatus 2 is integrally combined with the process container 4. Alternatively, the exciting section 50 may be separately disposed from the process container 4, so as to excite $NH_3$ gas outside the process container 4 (so called remote plasma), and then supply the excited $NH_3$ gas into the process container 4. A target substrate is not limited to a semiconductor wafer, and it may be another substrate, such as an LCD substrate or glass substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A film formation method for forming a silicon-containing insulating film on a target substrate by CVD, in a process field configured to be selectively supplied with a purge gas, a first process gas containing a silane family gas, and a second process gas containing a gas selected from the group consisting of a nitriding gas, an oxynitriding gas, and an oxidizing gas, the method being preset to repeat a cycle a plurality of times to laminate thin films formed by respective times, the cycle alternately comprising:

a first step of performing supply of the first process gas to the process field, while maintaining stoppage of supply of the second process gas and the purge gas to the process field;

a second step of performing supply of the purge gas to the process field, while maintaining stoppage of supply of the first and second process gases to the process field;

a third step of performing supply of the second process gas to the process field, while maintaining stoppage of supply of the first process gas and the purge gas to the process field; and a fourth step of performing supply of the purge gas to the process field, while maintaining stoppage of supply of the first and second process gases to the process field, wherein the cycle comprises continuously vacuum-exhausting the process field over the first to fourth steps through an exhaust passage provided with an opening degree adjustment valve, such that an opening degree of the valve in the first step is set to be 5 to 20% of an opening degree of the valve in the second and fourth steps, so as to control balance between promotion of adsorption of the silane family gas onto the target substrate and decrease in the number of particles present within the process field, and an opening degree of the valve in the third step is set to be equal to the opening degree of the valve in the second and fourth steps, or to be larger than the opening degree of the valve in the first step and smaller than the opening degree of the valve in the second and fourth steps.

2. The method according to claim 1, wherein the third step comprises an excitation period of supplying the second process gas to the process field while exciting the second process gas by an exciting mechanism.

3. The method according to claim 1, wherein the first step is arranged to supply a doping gas along with the silane family gas as part of the first process gas into the process field.

4. The method according to claim 3, wherein the silane family gas and the doping gas are supplied into the process field as a mixture gas mixed in a gas mixture tank disposed outside the process field.

5. The method according to claim 1, wherein the first process gas contains at least one gas selected from the group consisting of dichlorosilane, hexachlorodisilane, monosilane, disilane, hexamethyldisilazane, tetrachlorosilane, disilylamine, trisilylamine, and bistertialbutylaminosilane.

6. The method according to claim 1, wherein the second process gas contains at least one gas selected from the group consisting of ammonia, nitrogen, dinitrogen oxide, nitrogen oxide, oxygen, and ozone.

7. The method according to claim 1, wherein the purge gas is nitrogen gas.

8. The method according to claim 3, wherein the doping gas contains one or both of a third process gas containing a boron-containing gas selected from the group consisting of $BCl_3$, $B_2H_6$, $BF_3$, and $B(CH_3)_3$, and a fourth process gas containing ethylene gas.

9. The method according to claim 1, wherein the exciting mechanism comprises a plasma generation area disposed in a space communicating with the process field and between a supply port of the second process gas and the target substrate, and the second process gas is excited while passing through the plasma generation area.

10. The method according to claim 9, wherein the first process gas and the purge gas are supplied to the process field from a position between the plasma generation area and the target substrate.

11. The method according to claim 1, wherein the process field is configured to accommodate a plurality of target substrates at intervals in a vertical direction, and the target substrates are heated by a heater disposed around the process field.

12. The method according to claim 11, wherein each of the first and second process gases and the purge gas is supplied from a plurality of gas spouting holes to form gas flows parallel with the target substrates, and the gas spouting holes are arrayed over the target substrates in a vertical direction.

13. The method according to claim 1, wherein the exhaust passage comprises first and second exhaust passages disposed in parallel with each other and the valve comprises first and second valves for opening-degree adjustment disposed on the first and second exhaust passages, respectively, such that a total valve opening degree of the first and second valves is controlled as an opening degree of one equivalent exhaust valve equivalent thereto.

14. The method according to claim 13, wherein the second and fourth steps are arranged to set the first valve closed and to set the second valve opened to provide the equivalent exhaust valve with a certain opening degree, and the first step is arranged to set the second valve closed and to set the first valve opened to provide the equivalent exhaust valve with 5 to 20% of the certain opening degree.

15. A film formation method for forming a silicon nitride film by CVD on a plurality of target substrates accommodated at intervals in a vertical direction in a process field configured to be selectively supplied with a purge gas, a silane family gas, and ammonia gas, the method being preset to repeat a cycle a plurality of times to laminate thin films formed by respective times, the cycle alternately comprising:

a first step of performing supply of the silane family gas to the process field, while maintaining stoppage of supply of the ammonia gas and the purge gas to the process field;

a second step of performing supply of the purge gas to the process field, while maintaining stoppage of supply of the silane family gas and the ammonia gas to the process field;

a third step of performing supply of the ammonia gas to the process field, while maintaining stoppage of supply of the silane family gas and the purge gas to the process field, the third step comprising an excitation period of supplying the ammonia gas to the process field while exciting the ammonia gas by an exciting mechanism; and a fourth step of performing supply of the purge gas to the process field, while maintaining stoppage of supply of the silane family gas and the ammonia gas to the process field, wherein the cycle comprises forming a mixture gas by mixing the silane family gas with ethylene gas in a gas mixture tank disposed outside the process field, such that the first step is arranged to supply the silane family gas and the ethylene gas as the mixture gas into the process field, and wherein the cycle comprises continuously vacuum-exhausting the process field over the first to fourth steps through an exhaust passage provided with an opening degree adjustment valve, such that an opening degree of the valve in the first step is set to be 5 to 20% of an opening degree of the valve in the second and fourth steps, so as to control balance between promotion of adsorption of the silane family gas onto the target substrates and decrease in the number of particles present within the process field, and an opening degree of the valve in the third step is set to be equal to the opening degree of the valve in the second and fourth steps, or to be larger than the opening degree of the valve in the first step and smaller than the opening degree of the valve in the second and fourth steps.

16. The method according to claim 15, wherein said forming a mixture gas is arranged to form the mixture gas by mixing the silane family gas and the ethylene gas further with a boron-containing gas in the gas mixture tank, and the first step is arranged to supply the silane family gas, the ethylene gas, and the boroncontaining gas as the mixture gas into the process field.

17. The method according to claim 15, wherein the exhaust passage comprises first and second exhaust passages disposed in parallel with each other, and the valve comprises first and second valves for opening-degree adjustment disposed on the first and second exhaust passages, respectively, such that a total valve opening degree of the first and second valves is controlled as an opening degree of one equivalent exhaust valve equivalent thereto.

18. The method according to claim 17, wherein the second and fourth steps are arranged to set the first valve closed and to set the second valve opened to provide the equivalent exhaust valve with a certain opening degree, and the first step is arranged to set the second valve closed and to set the first valve opened to provide the equivalent exhaust valve with 5 to 20% of the certain opening degree.

* * * * *